(12) United States Patent
Begle et al.

(10) Patent No.: US 6,383,893 B1
(45) Date of Patent: May 7, 2002

(54) METHOD OF FORMING A CRACK STOP STRUCTURE AND DIFFUSION BARRIER IN INTEGRATED CIRCUITS

(75) Inventors: Edward S. Begle, Middletown, NY (US); Richard P. Volant, New Fairfield, CT (US); Kevin S. Petrarca, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/752,622

(22) Filed: Dec. 28, 2000

(51) Int. Cl.⁷ .................. H01L 21/46; H01L 21/78; H01L 21/301
(52) U.S. Cl. .............. 438/460; 438/462; 438/940
(58) Field of Search .................. 438/18, 113, 401, 438/460, 462, 691, 975, 464, 459, 940

(56) References Cited

U.S. PATENT DOCUMENTS

| | | | | |
|---|---|---|---|---|
| 5,691,248 A | * | 11/1997 | Cronin et al. | 437/227 |
| 5,872,018 A | * | 2/1999 | Lee | 438/18 |
| 5,898,227 A | * | 4/1999 | Geffken et al. | 257/797 |
| 5,925,924 A | * | 7/1999 | Cronin et al. | 257/622 |
| 5,977,558 A | * | 11/1999 | Lee | 257/48 |
| 6,066,513 A | * | 5/2000 | Pogge et al. | 438/113 |
| 6,084,287 A | * | 7/2000 | Mitwalsky et al. | 257/620 |
| 6,271,578 B1 | * | 8/2000 | Mitwalsky et al. | 257/620 |
| 6,180,498 B1 | * | 1/2001 | Geffken et al | 438/462 |
| 6,221,775 B1 | * | 4/2001 | Ference et al. | 438/691 |

* cited by examiner

Primary Examiner—John F. Niebling
Assistant Examiner—Walter L. Lindsay
(74) Attorney, Agent, or Firm—Connolly Bove Lodge & Hutz, LLP; Todd Li

(57) ABSTRACT

A method for forming a crack stop structure and a barrier to the diffusion of oxygen and water vapor in integrated circuits is provided.

14 Claims, 5 Drawing Sheets

METHOD OF FORMING A CRACK STOP STRUCTURE AND DIFFUSION BARRIER IN INTEGRATED CIRCUITS

FIELD OF THE INVENTION

The present invention relates generally to integrated circuits, and particularly, but not by way of limitation, to semiconductor devices, such as a dynamic random access memory (DRAM) devices, wherein a plurality of such devices are fabricated on a wafer which is subsequently diced into individual chips.

BACKGROUND OF THE INVENTION

In semiconductor fabrication, insulating, semiconducting, and conducting layers are formed on a substrate. The layers are patterned to create features and spaces, forming devices, such as transistors, capacitors, and resistors. These devices are then interconnected to achieve a desired electrical function, thereby producing an integrated circuit (IC). the formation and patterning of the various device layers are achieved using conventional fabrication techniques, such as oxidation, implantation, deposition, epitaxial growth of silicon, lithography, etching, and planarization. Such techniques are described in S. M. Sze, *VLSI Technology*, $2^{nd}$ed., New York, McGraw-Hill, 1988, which is herein incorporated by reference for all purposes.

To increase throughput, a plurality of ICs are fabricated on a wafer in parallel. The ICs are then separated into individual chips. The process of separating the wafer into individual chips is typically referred to as "dicing." Conventionally, various dicing techniques, such as "grind-out" and "scribe and break" are employed. Such conventional dicing techniques are described in U.S. Pat. No. 3,942,508 to Shimizo, which is incorporated herein by reference for all purposes.

Refering to FIG. 1, a portion of a wafer 100 is depicted. Illustratively, the wafer comprises ICs 114 and 115 separated by a channel 120. Channel 120 is the area in which the dicing tool cuts or scribes to separate the ICs. The width of the channel is, for example, about 100 microns ($\mu$m). Typically, the channel is covered with a dielectric layer 121, such as oxide. The surface of the wafer is covered with hard and soft passivation layers 124 and 125, respectively. The hard passivation layer, for example, comprises silicon dioxide or silicon nitride and the soft passivation layer comprises polyimide. The passivation layers serve to protect the surface of the ICs. Prior to wafer dicing, the passivation layers in the channel are typically removed, leaving a portion of the dielectric layer of the metallization.

As the dicing tool cuts or scribes the wafer, cracks and chips result. Due to the properties of the typical dielectric layer, cracks propagate from the area where the dicing tool cuts the wafer. Cracks in excess of a few microns in depth and several tenths of millimeters in length have been observed. In some instances, such cracks can extend from the cutting edge into the active chip areas, causing significant reliability degradation in the resulting ICs. This decreases the yield of ICs per wafer.

From the above discussion, it is apparent that there is a need to reduce the propagation of cracks and chips that result from dicing.

Other objects and advantages will become apparent from the following disclosure.

SUMMARY OF INVENTION

The invention provides a method for forming a crack stop structure and diffusion barrier in integrated circuits comprising the steps of:

providing a semiconductor wafer wherein said wafer contains at least one integrated circuit die finished through provision of BEOL structures;

forming a groove in the kerf region wherein the cross-section of said groove is substantially trapezoidal having a top width and a bottom width and wherein forming a groove comprises laser ablation; and depositing a sealing layer. The sealing layer is chosen from materials that are substantially gas and moisture impermeant.

The present invention simplifies BEOL fabrication because it does not require special BEOL processing to create crack stop structures. BEOL fabrication is also simplified in that the present invention eliminates the requirement for first incorporating and then etching crack stop metals. The present invention also eliminates the additional processing steps and mask sets required.

The present invention provides for the removal of multiple layers of organic insulator and inorganic passivation layers using a single laser ablation process step. the invention provides for the passivation of exposed edges of the organic dielectric material in order to prevent the diffusion of oxygen and of moisture into the Cu features.

The invention provides semiconductor devices fabricated by the disclosed methods.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BRIEF DESCRIPTION OF DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DESCRIPTION OF A PREFERRED EMBODIMENT

Reference is made to the figures to illustrate selected embodiments and preferred modes of carrying out the invention. It is to be understood that the invention is not hereby limited to those aspects depicted in the figures.

Figure 1:
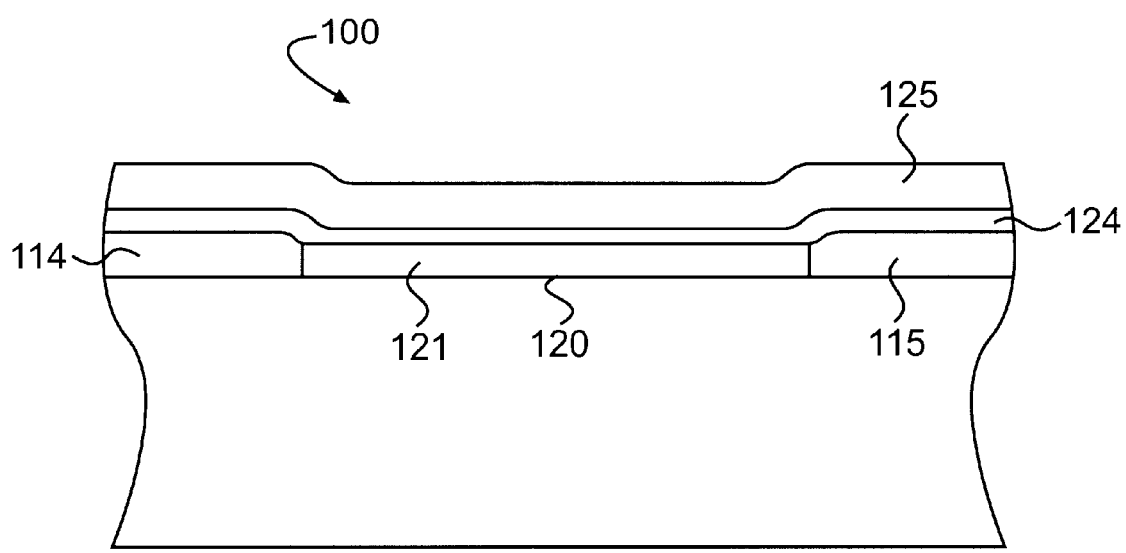
FIG. 1 illustrates a wafer having ICs separated by a channel.
Figure 2:
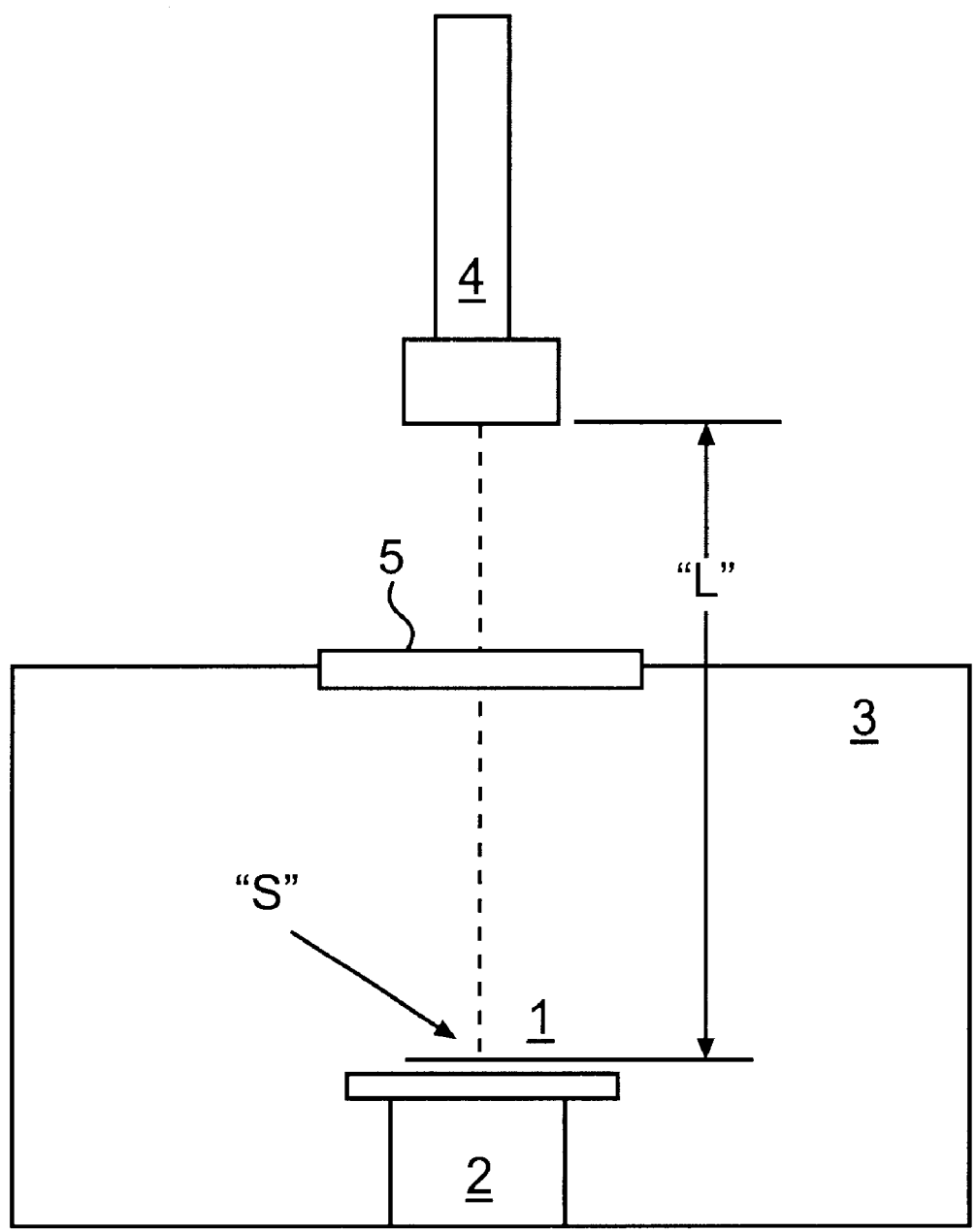
FIG. 2 is a schematic of laser ablation apparatus.

Turning now to FIG. 2. a system is shown wherein rapid removal of material in the kerf area of a semiconductor wafer may be accomplished. This process is useful in multi-level metal wiring schemes where it is desired to fill these resulting features with a passivating material prior to dicing the wafer into individual integrated circuit chips. Suitable passivation materials include PVD or CVD inorganic insulators, such as $SiO_2$, which is preferred, or $SiN_x$, SiCOH, and Black Diamond (AMAT). Otherwise, edges of the inter-level dielectric material, which may be an organic such as polyimide, would be exposed to the environment. As shown in FIG. 2, a semiconductor wafer 1, upon which a multi-level wiring structure has been fabricated, is located on a fixture 2 inside a process chamber 3. The fixture has an "X-Y" movement feature so that the location of the laser light impingement "S" may be varied over the entire surface of the substrate. Also, depending on the mode of operation of the invention, the fixture may have a "Z" movement feature to vary the optical path length "L". At 4 is symbolized a laser light source of the correct wavelength and of sufficient power level and/or pulse duration to generate a local region of photo-chemical ablation S of organic insulators on the substrate. At 4, there is also located focusing optics to adjust the focal length and the light spot size at "S". Also, an optic-beam scanning feature may be included at 4 as an alternate method of varying the beam impingement point "S".

Figure 3:
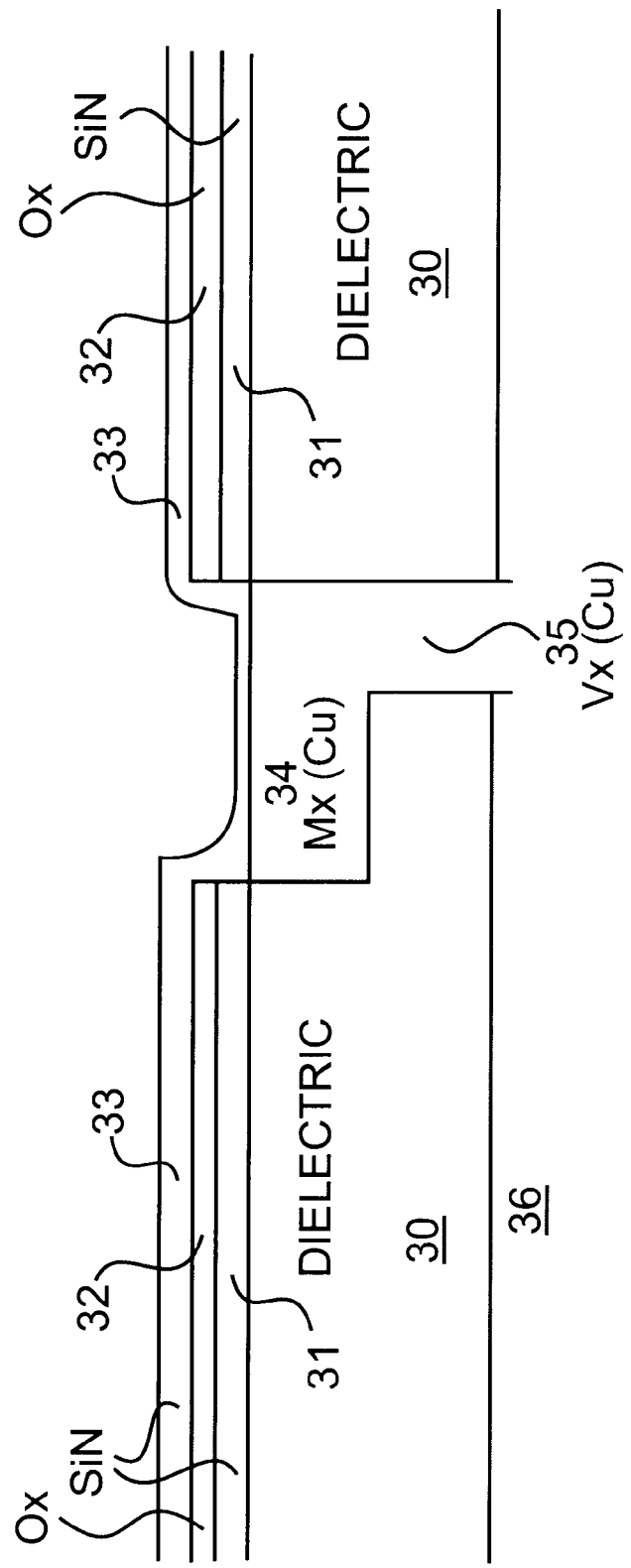
FIGS. 3–5 illustrate details of processing steps.

With reference to FIG. 3, what is shown is the kerf region of a die prior to ablation of a channel and slicing into chips. A dielectric layer 30, associated with the BEOL structure, is shown over the FEOL structure 36. The dielectric layer is typically an organic material such as SiLK (Trademark of Dow Chemical Company). Also shown is the copper wiring typical of BEOL structures including a copper via 35 and copper level wiring 34. The BEOL structure is typically finished with layers of silicon nitride 31, an oxide layer 32, and a second silicon nitride layer 33.

Figure 4:
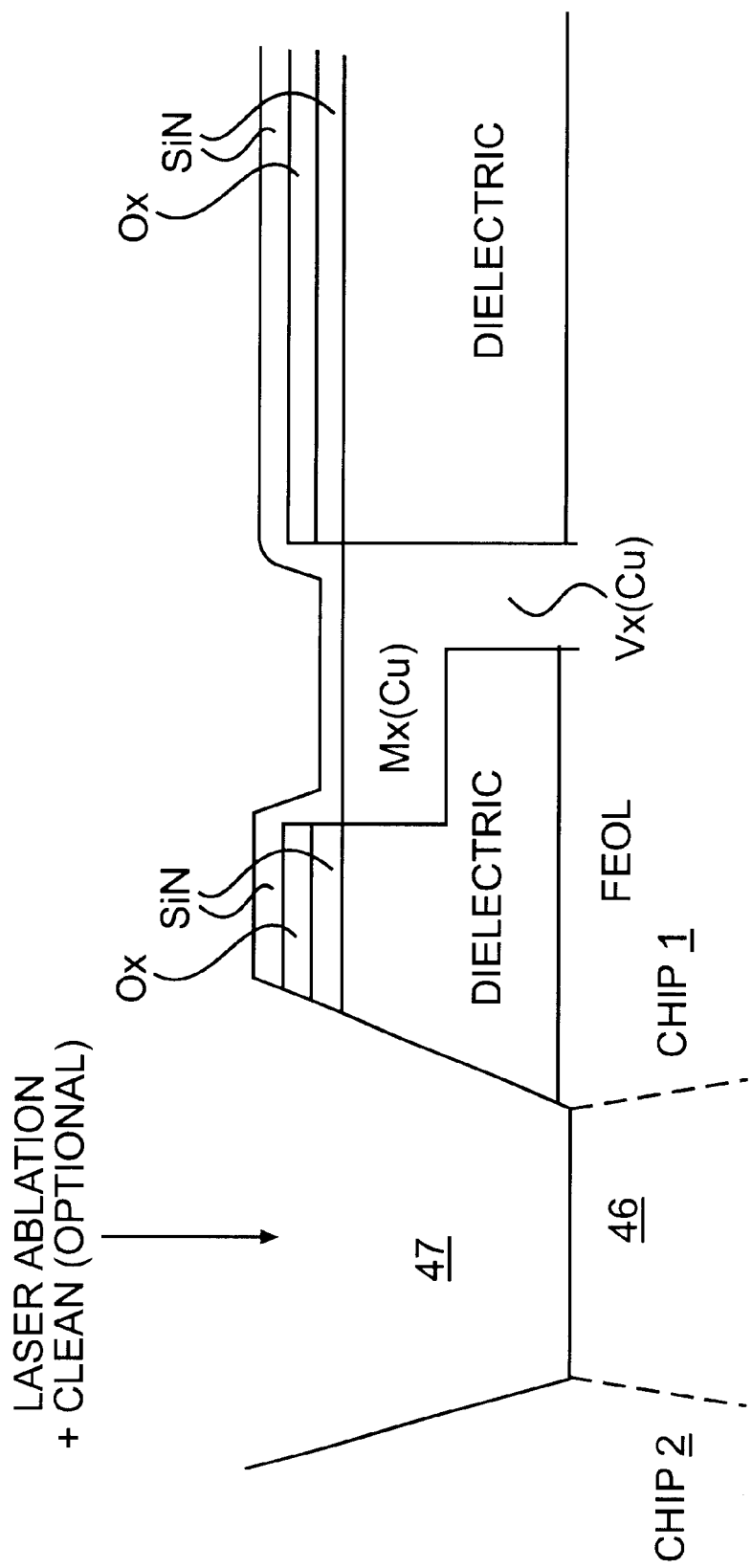

Turning to FIG. 4, a groove 47 is shown having been formed in the kerf area of the wafer. The plurality of dies comprising the wafer are ultimately sliced into individual chips by passing a saw through a plurality of such grooves. Formation of the groove pattern can be done by, but is not limited to, 1X projection of the ultraviolet light, imaging a mask pattern onto the workpiece. Other techniques could be used, such as reduction imaging of a mask pattern, contact printing of a mask pattern or blanket illumination of a mask pattern created on the workpiece.

The ultraviolet light source in this invention can be a range of Eximer Lasers from xenon fluoride or argon fluoride, but not limited to these. The ultraviolet light source will need to have a wavelength of 150 nm to 400 nm. Experiments using a 308 nm wavelength have been successful. The minimum power required to remove organics is typically 50 mj/cm$^2$. A power of 175 mj/cm$^2$ has been used successfully.

The base silicon of the FEOL structure acts as stop for the laser ablation process.

The minimum feature width is a function of the resolution of the optical system employed and is typically about 6 micrometers. The bottom dimension of the groove is reduced from the top dimension by an amount roughly equal to the thickness of the dielectric polymer. The ablation process naturally gives rise to an angled wall in the polymer ablated. Thus the groove has a substantially trapezoidal cross-section. It is preferred that the minimum feature size is about 15 micrometers.

Without scanning the beam, the maximum feature width is a function of the beam width. The test vehicle had a beam width of 12 millimeters. Wide beams are associated with the production of extensive amounts of debris, an undesired condition because of the potential for contamination. Preferably, the upper limit on feature size is about 250–300 micrometers. Wider features could be accommodated by the addition of process clean steps. The length of the groove is user controlled by appropriately stepping the x-y mount.

The maximum ablated depth is a function of the etch rate of the polymer (# $\mu$m removed per pulse) and the maximum number of pulses that can be delivered by the tool.

Typical etch rates on ablation tools are 0.05 to 0.1 $\mu$m/pulse at 308 nm in nonlayered simple polymer layers. The tool set used can deliver a maximum of 1000 pulses which could ablate a maximum of 50 $\mu$m of poly. In practice, layers thicker than 18–20 nm are not ablated, and the typical product is 10 $\mu$m thick.

In the present invention, the amount of light delivered to the Silk is attenuated by the inorganic passivants, and ablation is likely to be limited to the top layer until it is completely removed. An estimate of the etch rate of the passivated Silk is 0.02 $\mu$m/pulse. This implies a maximum total stack thickness (0.5–0.6 $\mu$m Silk layers) of 20 $\mu$m could be ablated, with the tool set used (1000 pulse maximum). The present invention uses a minimum 100% overetch, so, in manufacturing, a maximum of 10 $\mu$m total stack thickness is ablated. This implies a roughly 20 layer semiconductor product build.

Figure 5:
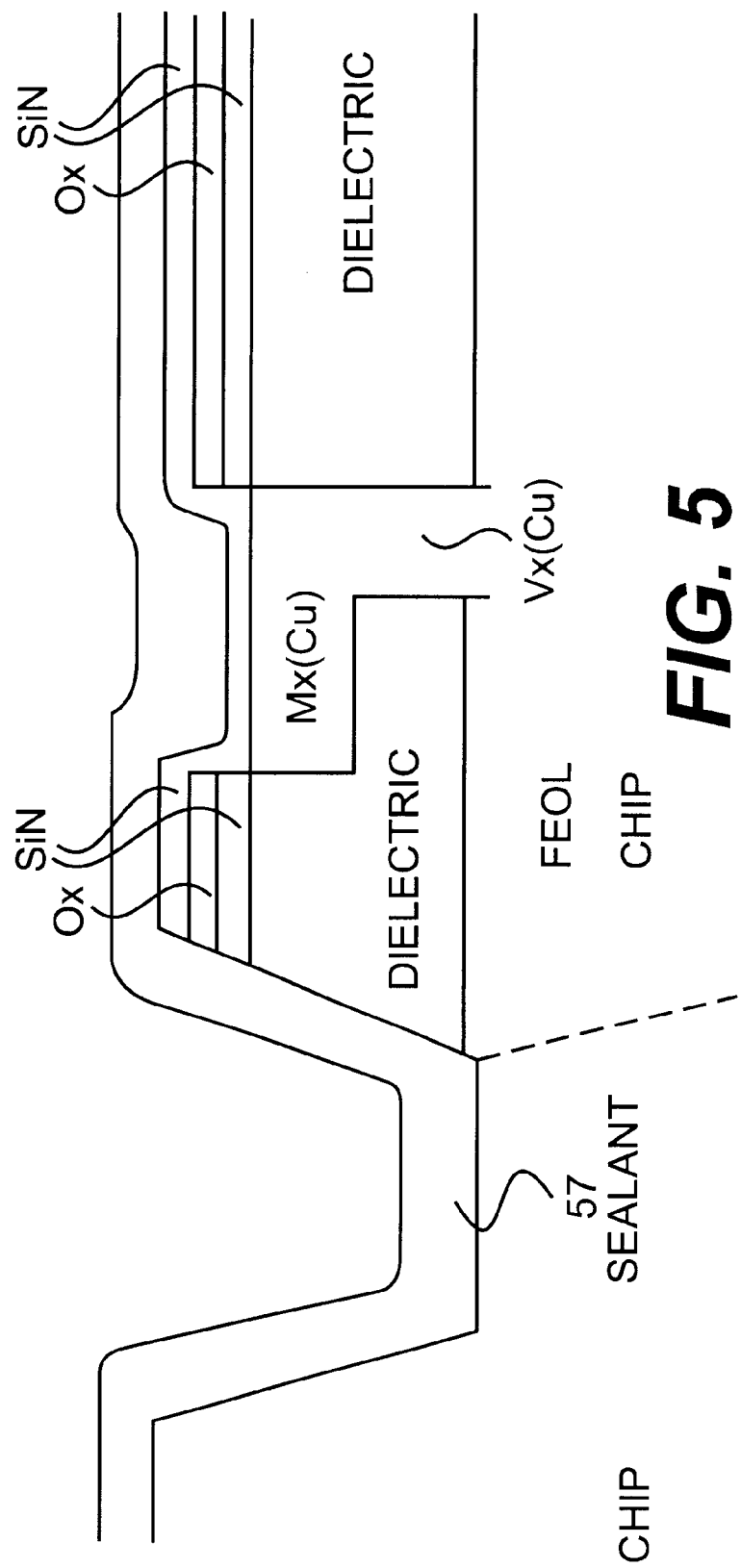

Turning to FIG. 5, a diffusion barrier, substantially impermeable to oxygen and moisture, is applied 57. Such a barrier acts to prevent corrosion of the copper structures associated with the BEOL. The thickness of this layer is from about 250 Å to about 8 micrometers and is preferably about 1 micrometer. Suitable materials must be dielectrics and be substantially impermeable to gasses, including oxygen and water vapor, and to moisture. Suitable passivation materials include PVD or CVD inorganic insulators, such as $SiO_2$, which is preferred, or $SiN_x$, SiCOH, and Black Diamond (AMAT).

It will, therefore, be appreciated by those skilled in the art having the benefit of this disclosure that this invention is a method for forming a crack stop structure and diffusion barrier in integrated circuits. Moreover, it will be realized that the invention is capable of producing integrated circuits so protected. Although the illustrative embodiments of the invention are drawn from the semiconductor arts, the invention is not intrinsically limited to that art. The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for forming a crack stop structure and diffusion barrier in integrated circuits comprising:
   providing a semiconductor wafer wherein said wafer contains at least one integrated circuit die finished through provision of BEOL structures;
   forming a groove in the kerf region wherein the cross-section of said groove is substantially trapezoidal having a top width and a smaller corresponding bottom width and wherein forming a groove comprises laser ablation; and depositing a sealing layer.

2. A method for forming a crack stop structure and diffusion barrier in integrated circuits according to claim 1 wherein said sealing layer is an electrical insulator and is not permeable to gas.

3. A method for forming a crack stop structure and diffusion barrier in integrated circuits according to claim 1 wherein said sealing layer is an insulator selected from the group consisting of $SiO_2$, $SiN_x$, $SiCOH_2$, Black Diamond, and like insulating materials used in semiconductor processing.

4. A method for forming a crack stop structure and diffusion barrier in integrated circuits according to claim 1 wherein the thickness of said sealing layer is from about 250 Å to about 8 micrometers.

5. A method for forming a crack stop structure and diffusion barrier in integrated circuits according to claim 1 wherein said laser has a wavelength from about 150 nanometers to about 400 nanometers.

6. A method for forming a crack stop structure and diffusion barrier in integrated circuits according to claim 1 wherein said groove is formed by laser ablation.

7. A method for forming a crack stop structure and diffusion barrier in integrated circuits according to claim 1 wherein said laser has a wavelength of about 308 nanometers.

8. A method for forming a crack stop structure and diffusion barrier in integrated circuits according to claim 1 wherein the power of said laser is greater than about 50 millijoules/centimeter$^2$.

9. A method for forming a crack stop structure and diffusion barrier in integrated circuits according to claim 1 wherein the power of said laser is about 175 millijoules/centimeter$^2$.

10. A method for forming a crack stop structure and diffusion barrier in integrated circuits according to claim 1 wherein said top width is substantially equal to the width of the ablation beam.

11. A method for forming a crack stop structure and diffusion barrier in integrated circuits according to claim 1 wherein said top width is from about 250 to about 1000 micrometers.

12. A method for forming a crack stop structure and diffusion barrier in integrated circuits according to claim 1 wherein said bottom width is a minimue of about 200 micrometers.

13. A method for forming a crack stop structure and diffusion barrier in integrated circuits according to claim 1 wherein the depth of said groove is up to about 50 micrometers.

14. A method for forming a crack stop structure and diffusion barrier in integrated circuits according to claim 1 wherein the depth of said groove is up to about 0 to about 20 micrometers.

* * * * *